United States Patent [19]

Miller

[11] 4,068,371
[45] Jan. 17, 1978

[54] METHOD FOR COMPLETING WIRE BONDS

[76] Inventor: Charles Fredrick Miller, 2165 N. Glassell, Orange, Calif. 92667

[21] Appl. No.: 704,319

[22] Filed: July 12, 1976

[51] Int. Cl.² .................................................. H01R 43/02
[52] U.S. Cl. ........................................ 29/628; 228/4.5; 228/179
[58] Field of Search .................. 29/628; 228/4.5, 179

[56] References Cited

U.S. PATENT DOCUMENTS

| | | | |
|---|---|---|---|
| 3,627,192 | 12/1971 | Killingsworth | 228/4.5 X |
| 3,648,354 | 3/1972 | Mashino et al. | 228/4.5 X |
| 3,689,983 | 9/1972 | Eltzroth et al. | 228/4.5 X |
| 3,747,198 | 7/1973 | Benson et al. | 228/1 X |
| 3,787,966 | 1/1974 | Klossika | 29/628 |
| 3,954,217 | 5/1976 | Smith | 228/110 |

Primary Examiner—Carl E. Hall
Attorney, Agent, or Firm—Grover A. Frater

[57] ABSTRACT

Improved wire bonds between circuit points of such apparatus as semiconductor devices and integrated circuit units are accomplished by bonding one end of a wire to one of the circuit points and then paying out from a tool through which the wire is threaded, a length of wire sufficient to form a loop between the first bond point and the second bond point. That having been done, the wire is prevented from paying out of, or back into, the tool while the tool and the wire are lowered to the second bond point where the second bond is completed.

4 Claims, 8 Drawing Figures

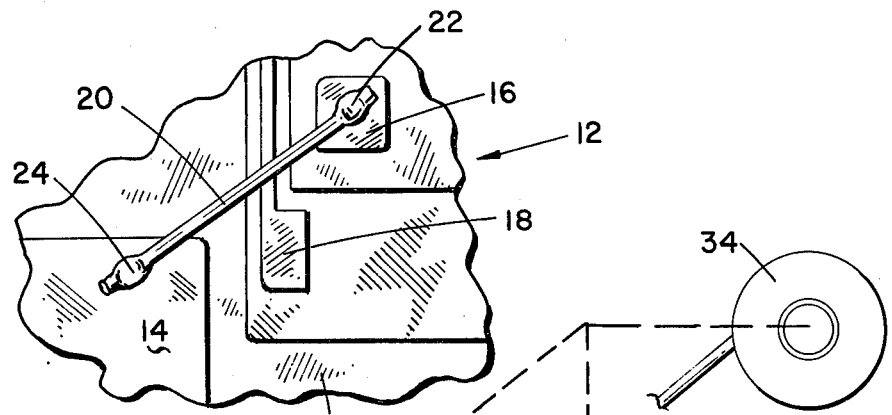
FIG. 1
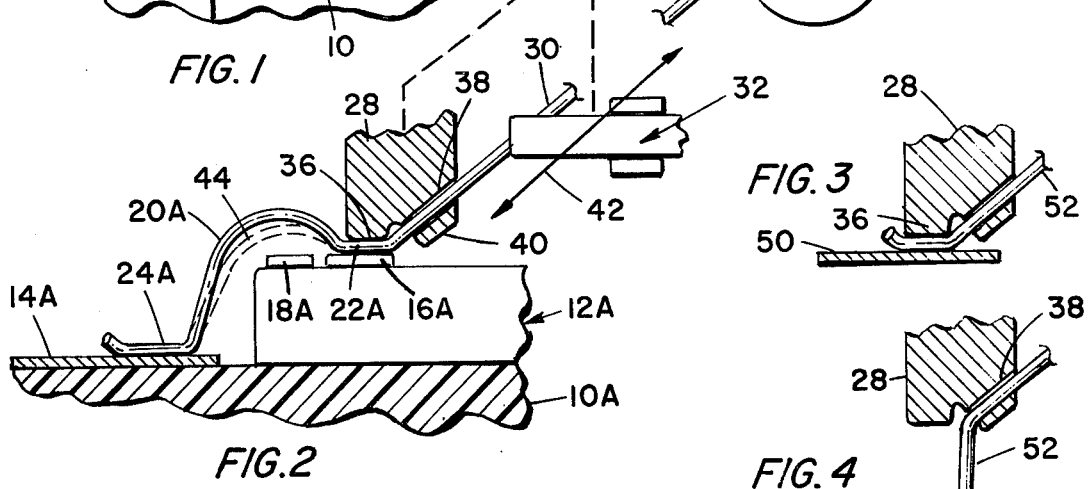
FIG. 2
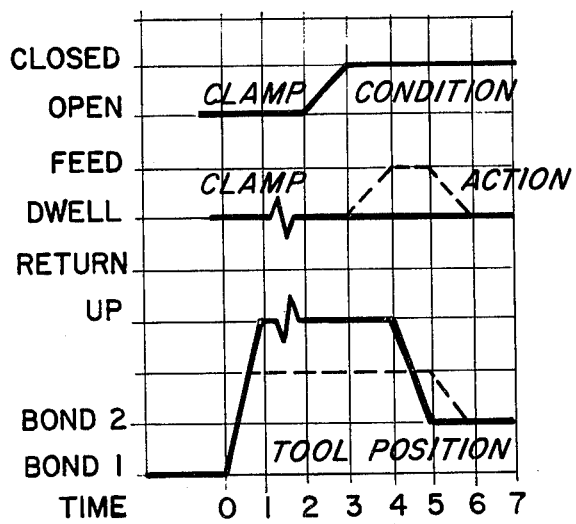
FIG. 8
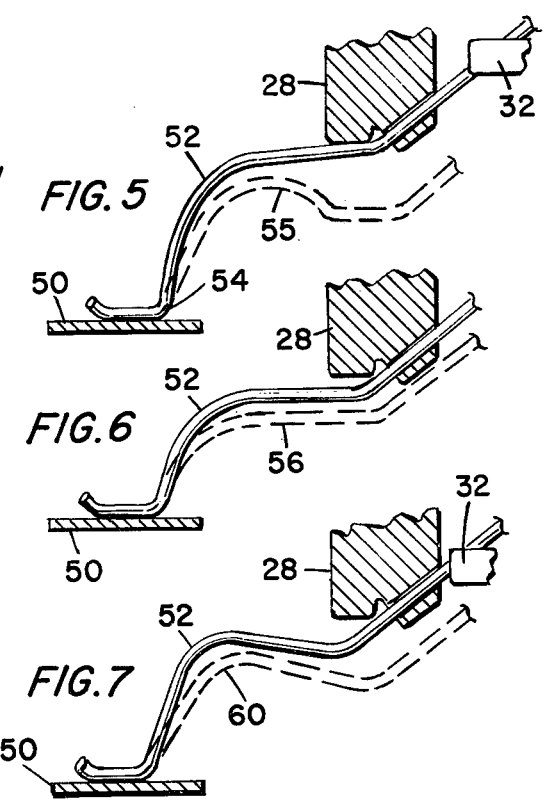
FIG. 3
FIG. 4
FIG. 5
FIG. 6
FIG. 7

METHOD FOR COMPLETING WIRE BONDS

This invention relates to improvements in methods and means for completing wire bonds between electric circuit points.

BACKGROUND OF THE INVENTION

One of the procedures by which circuit points of electronic assemblies are interconnected is called "wire bonding." While wire bonding has other applications, the term is usually associated with the process of interconnecting circuit points of semiconductor devices and integrated circuit devices with fine wires. The process finds very important application in completing connections from surfaces of semiconductor devices and integrated circuit chips to the internal portion of the connector leads which will extend from the packages for those units. The wires used may have diameters in the order of 1 mil or less. They are bonded to circuit points having an area of only a few square mils and the circuit points that are interconnected may be separated by no more than a few mils. Thus it is that wire bonding is conducted on a micro-miniature scale.

In general, wire bonding techniques and apparatus have kept pace with advances in the production of semiconductor and integrated circuit devices so that the cost of producing such devices has decreased greatly. Nonetheless, some difficult wire bonding problems have gone without a satisfactory solution. Among those problems has been difficulty in paying out an adequate length of wire during wire bonding process while leading a wire from one bond to another. Failure to pay out an adequate length of wire, or to properly shape that length, may lead to inadvertent creation of short circuits resulting from the interconnecting wire touching other circuit points. While that problem is generally common to all of the classes of wire bonding, it is particularly troublesome in connection with those wire bonding procedures in which a side of the wire is bonded to the circuit point. In such a case, the wire extends laterally rather than perpendicularly from the circuit point. If the wire connector is not bent away and looped up from the asembly in adequate degree, it may touch other circuit points at points along its length.

In a large proportion of the applications in which wire bonding is used, the bond is made between circuit points that lie in different but parallel planes. By way of example, it is common in integrated circuit and semiconductor production to mount the integrated circuit chip, or the semiconductor dice, upon a platform which also carries the inner end of the external lead structures. Those structures, which often form part of what is called a "frame" are not as thick as is the dice or chip. The interconnecting wire leads from a low elevation at the external conductor to a higher elevation on the chip or dice. The incidence of short circuiting by interconnector wires can be reduced somewhat by beginning at the circuit point on the dice or chip and ending at a second circuit point on the external connector. However, the length of wire that will extend from the first bond to the second is payed out by pulling the wire against the initial bond. It is not uncommon for that bond to break as a result of that pulling. The circuit points, called "pads," on dice and integrated circuits are very often too small to accommodate a second bond in a second attempt to make the required connection. That difficulty is overcome by beginning at the external connector which usually has much larger surface area. But to do that greatly increases the risk of short circuits when side bonding the wires.

The need for side bonding can be avoided by using gold wire and melting the end of the wire to form a ball before making the bond. That solution is not availiable in making bonds with aluminum wire. Melting the aluminum to form a ball results in the production of oxides that prevent proper bonding. Accordingly, it is almost universal practice to bond aluminum wires by laying a side of the wire against the circuit point to which it is to be bonded and then applying sonic energy to the bond surfaces using a sonically vibrating tool.

To prevent that kind of short circuit, as described above, it is required only to provide a length of wire that is greater than the separation of the two circuit points to be interconnected, and to loop that wire up so that it avoids contact with any of the structure in between those two circuit points. That sounds easy, but to accomplish that result has proven to be very difficult. The distances between circuit points and the diameter of the wire is too small to permit the use of pre-cut connector wires. The bonding is completed by bonding one end of the wire to one circuit point, paying out a length of wire sufficient to reach the second circuit point, and then completing the bond at that second point. The wire is taken from a continuous length and is severed after the second bond is completed. In general, it has not been feasible to push on the wire to make available a length of the wire sufficient to complete connection between two points. Instead, wire is payed out after the first bond is made by pulling on it. Pulling is accomplished by moving the first bond away from the source of wire, or, conversely, by pulling the source away from the first bond. In most instances, the standing part of the wire is stored on a spool. However, to provide a means for shaping the wire, it is common to mount the spool with the bonding tool and to extend the wire from the spool through an opening or passageway in the tool. The wire must move through that passageway freely. Relative movement between the first bond and the tool results in the standing part of the wire being moved through the passageway. As the tool is moved from the position of the first bond to the second, the standing part of the wire is payed out by being pulled through that passageway. However, the task of moving the tool includes the requirement to search for the second bonding point. As often as not, the tool is moved past the second bonding point. It must be returned to it in the search procedure. The need for such a return, and the distance that must be traversed in making such a return, is variable. That means that the length of wire that is payed out in the attempt to move from the first to the second bond is variable. That variation in length has been accommodated in the past by the fact that the standing part of the wire is easily moveable through the passageway by which it extends through the tool. If the tool is moved back toward the first circuit point, the tool moves relative to the wire so that the excess length of wire is payed into the passageway rather than payed out of it.

In prior art method, the shape of the wire conductor, as its extends from the first to the second bond, is determined primarily by the stiffness of the wire and the direction in which the tool was moving at the time that it left the first bond. It is not practical to select wire of different stiffness to complete each interconnection because the several pairs of circuit points that must be connected on an integrated circuit chip is different in the case of each of them. Accordingly, in the prior art, the only method available for shaping the loop between the first bond and the second bond has been to control the angle at which the wire is pulled as it leaves the first bond, and to some extent, to control the height to which the tool is lifted as the wire is payed out. That latter expedient is not particularly effective in the case of the prior art method. The tool through which the wire extends is moved upwardly and then laterally over the region of the second circuit point. There, the tool is lowered. If the wire is sufficiently stiff so that it is caused to stand upwardly at the beginning of the loop, then that stiffness will serve to prevent easy bending of the wire at the second circuit point. Instead, the whole wire is moved down horizontally and laid against the pad under the bonding tool, and it extends substantially horizontally away from the pad. While the wire can be made to begin to loop upward at the first bond, the loop characteristic is lost almost entirely in the vicinity of the second bond.

SUMMARY OF THE INVENTION

It is an object of the invention to provide a method by which the wire that completes connection between two bond points can be shaped so that the incidence of short circuiting is greatly reduced. It is an object to provide a method in which the wire that interconnects the circuit bond can be looped readily over the distance between those two circuit points. It is an object to provide such a method which can be accomplished automatically at high speed and which is applicable to a wide range of conductor diameters and to a wide range of wire stiffness. A related object is to provide a method which can be practiced with existing machines after a minimum amount of modification.

Another object of the invention is to conduct a bonding procedure such that the length of wire required to complete the bond between the first and second circuit points is provided by using a tool, or other implement, through which the wire is threaded to pull on the wire after the first circuit bond is made. Wire is payed out, or pulled from, the source as that tool or implement is moved away from the first bond position to a point above the second bond position. A length of wire sufficient to form a looping arc is payed out. If any searching is required, it is done while permitting the wire to move freely in both directions through the tool or apparatus through which it is threaded. When the tool is placed over the second bond point, the wire is prevented from paying back into the tool such as to decrease the length of wire between the tool and the first bond point. While preventing such movement, the tool and the wire that is threaded through it are lowered to the second bond point and the wire is forced to loop shape. There are two ways in which that can be accomplished. One is to pay out an adequate length of wire by lifting the tool to a predetermined high elevation as the wire is payed out. Since the wire must be free to move through the tool in either direction during the search to place the tool over the second bond, the tool must have its high elevation at a point in the path of tool movement as it is lowered to the second bond point. The tool is then lowered to bring the wire into contact with the second bond point, while preventing the wire from being payed out or being payed into the tool.

In an alternative form of the method, which is particularly for use with bonding machines that lack a means for beginning downward motion of the tool toward the second bond from a prescribed, and adequate, height. The method can be practiced by pushing an additional length of wire to pay it out from the tool whereby to increase the total length of wire from the initial bond to the tool. That is coupled with holding the wire against paying into or out of the tool during the final movement down to the second bond position.

It is possible, of course, to combine those two procedures so that the wire is payed out of the tool by pushing on it at the time that the tool is being lowered and during the initial downward motion of the tool.

DESCRIPTION OF THE DRAWINGS

In the drawings:

FIG. 1 is a top plan view of a fragment of an integrated circuit assembly showing a wire conductor interconnecting one of the pads on the surface of an integrated circuit chip with the internal end of an external connector pin;

FIG. 2 is a partly sectional view in elevation of the integrated circuit component of FIG. 1 together with portions of a wire bonder in a schematic representation of the manner in which bonding is accomplished;

FIGS. 3 through 7 are schematic representations of four relatively different times during the course of practicing the method of the invention; and FIG. 8 is a graph illustrating one manner in which the invention may be practiced.

DESCRIPTION OF THE PREFERRED METHOD OF PRACTICING THE INVENTION

Because it represents a major application for the invention, the drawings illustrate how wire bonds are made on integrated circuit devices. The integrated circuit may be formed on a semiconductor substrate. Impurities and conductive layers and non-conductive layers of materials are added and the whole is fired to the end that an integrated circuit chip is formed. To be useful, electrical connection must be made to the chip at a number of pads formed at its surface. These pads are formed of a material to which wires, in this case aluminum wires, may be bonded. The external terminals of what has become the most popular type of integrated circuit package are stamped from a flat strip of metal. In the initial stamped condition, the outer end of each pin remains connected to a common part of the metal strip. The common part serves to maintain all of the pins in proper relative position during manufacture of the unit, and will be trimmed away later in a finishing step.

FIG. 1 assumes that such a frame is placed upon a base 10 so that the inner ends of the several pins lie in a plane around a central area into which the integrated circuit chip 12 is places. There are fourteen and sixteen such pins in the most common integrated circuit units.

Both the connector pins and the chip may be bonded to the base 10 with an adhesive. In FIG. 1, the inner end 14 of one external connector pin is visible. Several areas of the integrated circuit chip are shown, including two areas, 16 and 18, which serve as pads by which electrical connection may be made to portions of the chip. The pins are connected to the chip by wires which are bonded at one end to a pad on the chip, and are bonded at the other end to the inner end of one of the pins. In FIG. 1, pad 16 of the chip is bonded to pin 14 by a conductor wire 20. In this case, the bond has been accomplished ultrasonically at the points at which the wire is slightly compressed. Thus, the wire is bonded to pad 16 at region 22 of the wire, and it is bonded to pin 14 at region 24.

In this case, the wire 20 has a diameter of 1 mil. The pad 16 is approximately square and measures about 4 mils from side to side. If the bond at the pad 16 were to be formed first, and if the wire 20 were to break as wire was payed out toward a pin 14, the area remaining on the pad 16 might very well be too small to accommodate a second bonding attempt. In that case, the unit could not be salvaged. Since the inner end of pin 14 has a much larger area, there is ample room for making a second bond and a salvage attempt would be feasible. Not only is the wire very fine, but the bonding procedure tends to embrittle the wire adjacent to the bond so that breakage is not uncommon. It will be obvious that it is preferred to begin the wire bonding procedure by making the initial bond at the circuit point that offers the larger area. However, to do that increases the risk of short circuiting between the conductor wire and the other circuit points. Why that is true will be apparent from what follows.

In FIG. 2, the wire bond is shown from the side, just before completion. The structure on which the bond is made corresponds to the structure shown in FIG. 1. Here, a chip, 12A, has been bonded by an adhesive to a base, 10A, adjacent to the inner end 14A of an external connector pin. The integrated circuit chip includes a pad, 16A, and another pad 18A. A conductor wire, 20A, has been bonded to the pin 14A and to the integrated circuit pad 16A. The portion of the wire 20A that is bonded to the pin 14A is identified by the reference numeral 24A. Similarly, the portion 22A of the wire has been bonded to pad 16A. Completed wire connections are broken adjacent to the second bond. That has not yet been done in FIG. 2. Instead, the standing part 30 of the wire still extends through the passageway 38 of the tool 28 and between the jaws of a clamp 32 to a storage reel 34. The tool 28 and the clamp 32 and the reel 34 are mounted on a common tool holder structure, and are moveable in the direction toward and away from the work. In most cases, that means that they are moveable up and down in the vertical direction. In some bonding tool structures, that common mechanism is also moveable in the horizontal plane. In the apparatus depicted in the drawings, the tool holder mechanism is moveable only in the vertical direction. The work is mounted upon a table that moves in the horizontal plane. Consequently, when completing a bond between two circuit points, the work is first moved so that the first circuit point is vertically under the tool 28. After the bond is made, the work is moved so that the second circuit point is under the tool. In the case of most bonding machines, the arrangement is such that the work is moved toward the operator after the first bond is made and the work is moved in preparation for making the second bond. Thus, the left side of the tool 28 in FIG. 2 faces the operator and is called the forward side of the tool. The tool ends at its lower, forward side in an anvil 36. The passageway 38 is formed through the lower rear heel portion of the tool. The bond is formed by sonic energy applied through the anvil.

The clamp 32 is capable of movement relative to the tool 28 and the reel 34 in the general direction indicated by the arrows 42. In practice, the clamp may move by tilting, but the lever arm will be sufficiently long so that the motion is essentially in a direction parallel to the direction in which the wire 30 extends in spanning the difference between opening 38 of the tool and the reel 34. If the clamp is closed on a wire, wire movement relative to the tool will be prevented so that wire cannot be payed out or payed in. If the clamp is closed and then moved toward the tool, a length of wire will be payed or pushed out through the opening 38. The wire may be broken adjacent to the second bond region 22A by closing the clamp on the wire and then lifting the clamp and the tool together. The result is that the wire will be broken adjacent to the second bond. It is also possible to break the wire by retaining the anvil against the second bond as shown in FIG. 2, and closing the clamp and moving it upwardly and away from the tool. The wire is weakest adjacent to the bond and can be expected to break immediately adjacent to the bond. Leaving the tool in lowered position aids in preventing the bond from being pulled loose while attempting to break the wire.

The shape of the wire 20A is representative of the shape of wire bonds made according to the invention. In that same FIG. 2, the dotted lines 44, just below wire 20A, represent the shape of wire bonds made according to the prior art method. When the bonding is accomplished on a structure which includes no circuit points intermediate the bond points with which the connector wire can form a short circuit, then the shape represented by lines 44 is entirely acceptable. However, when there is such a structure intermediate the bond points with which the connector wire could make contact, then the shape represented by lines 44 is not acceptable. A conductor having that shape might very well contact the element 18A, if not initially, then subsequently as the result of vibration or of bending during acceleration.

The manner in which the connector wire is made to have the shape represented by lines 44 and wire 20A is depicted in FIGS. 3 through 7, and in FIG. 8. It is assumed in these figures that a bond is to be made at two circuit points which are separated laterally and vertically in the same way that circuit points 14A and 16A are separated in FIG. 2. In FIGS. 3 through 7, the circuit point 50 corresponds to circuit point 14A in FIG. 2. The tool 28 is shown in FIG. 3 to occupy the position that it has when forming the first bond between the wire 52 and the circuit point 50.

The bond having been completed in FIG. 3, the tool 28 is lifted vertically upward. The wire 52 has its end secured to the circuit point 50. Consequently, as the tool is moved up, some of the wire is drawn out through, or payed out of, the opening 38 in the tool. There is enough friction between the wire and the inner surface of the opening 38, and in the reel 34 so that the wire is made to bend up sharply at the bond so that the elastic limit of the wire is exceeded whereby the wire takes a "set." That bend is designated 54 in FIG. 4. When the tool is elevated at some given distance above the first circuit point, vertical movement ceases and relative horizontal movement between the tool and the workpiece begins.

The combined distance of the vertical and the horizontal movement is such that a length of wire will have been payed out from the first bond to the tool which is equal to the length of wire required to form a loop which will stand up from the work throughout its entire length, even at the second bond point. At the end of horizontal movement, the tool must be directly over the second bond point. Since the tool may move through an arc rather than vertically, "directly over" means in the line of tool movement. When that condition has been obtained, the tool will have been moved through a lateral or horizontal distance equal to the distance between the first and second bond points. The additional length of wire required to form the loop is payed out as a consequence of the vertical movement of the tool. To insure that an adequate length of wire is available to make the loop, it is necessary only to elevate the tool to a substantial height above the second work point. What that height is will be defined more fully below. For the present, the proper degree of elevation is illustrated in FIG. 5 where the tool 28 is shown to be elevated to an acceptable height. It is also located directly above the second bond point. The wire 52 still stands vertically away from the bend 54, but immediately beyond the bend, the wire curves toward the tool 28 in a looping arc. The arc has been formed because the wire has some resilience, and because of friction between the tool and the wire as the wire is payed out.

Comparing FIGS. 2 and 5, if the clamp 32 is not closed in FIG. 5, and the tool is lowered to a position corresponding to what it has in FIG. 2, the wire 52 will be payed back into the tool and through the opening 38 as the tool is lowered. As a consequence of that, the wire 52 will have a shape corresponding to the shape of dotted line 44 in FIG. 2 when the tool has been lowered to the second bond position. That does not happen when employing the method of the inventin. In the invention, the wire 52 is prevented from being payed back through the opening 38. That can be, and is accomplished, by closing the clamp 32 and then lowering the tool holder so that the tool 28 and the clamp 32 are lowered together. When the tool reaches the level of the second bond, the wire 52 will be looped up and have a shape substantially like what is depicted by dashed line 55 in FIG. 5. That shape corresponds to the shape of the wire loop 20A in FIG. 2.

The method so described is easily practiced in bonding machines that incorporate a means for elevating the tool to some pre-established height at which lateral tool movement is accomplished when moving from the position of the first bond to the second bond, or as the work is moved relative to the tool. It is primarily the height above the second bonding position that needs to be uniform. Beginning downward movement from a uniform height is important where the bonding machine is programmed for automatic operation. During the setup procedure, operation is manually controlled. Subsequent operation can then be made automatic, except that in many instances it is necessary to interrupt automatic operation to permit searching for the second bond position.

Some bonding machines do not include a means for controlling the height of the tool from which it proceeds down to make the second bond. In such machines, the operator has freedom to adjust the height of the tool during the search procedure, except that the tool may not be lowered below some predetermined low level during that procedure. There is an alternative form of the invention which is particularly useful when practiced with such machines. A combination of FIGS. 3, 4, 6, and 7 illustrate that alternative method. Instead of the tool being retracted to a high position above the second bond point, it is moved to a lower search position above that point. If the tool is lowered without the wire being held against movement through the opening 38, the wire will move down to the position indicated by the dotted lines 56. That position corresponds, generally, to the shape depicted by lines 44 in FIG. 2. However, in the method of the invention, the standing part of the wire is pushed to pay wire through the opening 38 to increase the total length of wire between the first bond and the tool. That may be accomplished by closing the clamp 32 and moving it in the direction of arrow 42 of FIG. 2 toward the tool as shown in FIG. 7. Thereafter, while holding the wire against being payed back into the tool, the tool is lowered to a level corresponding to the second bond position. As a consequence of that, the wire will be given a loop shape similar to that indicated by dotted line 60 in FIG. 7. That dotted line has a shape that corresponds, generally, to the shape of dotted line 55 in FIG. 5 and the shape of the loop 20A in FIG. 2.

The production of uniform bonds requires that the wire be free to pay in and out of the tool during the search procedure. Thus, the wire may be clamped against being payed into the tool, or pushed to pay out an additional length of wire, only after the tool has been positioned over the second bond point. Searching is difficult to accomplish when the tool is elevated to a point substantially above the bond position. To accomplish searching, one must be able to observe both the tool and the work, and that generally requires that observation be made from the side rather than from a point directly over the second bond point. The wire of the tool and the work place are so small that they must be viewed through a high magnification microscope. Depth perception, even with a stereo microscope, tends to be distorted. The problem is complicated because the bonding tool is often mounted for pivotal movement so that it moves in an arc. Notwithstanding that the lever arm of pivotal movement is usually long, if searching is conducted from an elevated point, the arc of movement is sufficiently long so that the tool will not move to engage a point on the workpiece that is vertically below the search position from which downward movement is begun. Consequently, practice of the preferred form of the invention is limited to those situations in which the tool can be accurately positioned above the second bond point, notwithstanding that the searching is conducted at an elevated position. A means for accurately positioning the tool at any elevation above the work is available in the structure described in Applicant's co-pending application, Ser. NO. 595,790 now U.S. Pat. No. 4,000,948. By using the method and means there described, or any other method or means that will provide the same result, the search process can be conducted t a level many thousandths of an inch above the bond point. The lever that is selected depends upon how high a loop it is desired to produce. The relative level depicted in FIG. 5 represents a preferred mode of practicing the invention.

The graph of FIG. 8 describes the condition of the clamp and the movement of the clamp relative to the tool and motion of the tool and the clamp with the structure on which both are mounted. Only that portion of the operating cycle is shown which involves paying out of wire from the first bond position to the second bond position. The upper line in the graph is labelled "CLAMP CONDITION" and describes whether or not the clamp is open or closed. The middle line of the graph is labelled "RELATIVE CLAMP MOVEMENT" and it depicts relative movement between the clamp and the tool. The term "dwell" is used to describe the circumstance in which there is no relative movement between the clamp and the tool. Ther term "feed" indicates movement of the clamp toward the tool in a way that would result in paying out wire through the tool if the clamp is closed. The term "return" indicates the condition in which the clamp is moving relatively away from the tool.

The lower line in FIG. 8 describes the vertical position of the structure on which the tool, clamp, and wire spool are mounted. Thus, it depicts the vertical position of the tool and of the position of the clamp except as the position of the clamp is modified by relative movement between tool and clamp.

The tool is lifted off of the first bond point at time 1 in the graph. At time 2 it has reached an elevation at which horizontal movement is to begin. During the interval from time 0 to time 1, the clamp is open and there is no relative movement betwen the clamp and the tool. In fact, in the preferred form of the invention in which the wire is simply restrained against being payed out or being payed into the tool, there is no relative movement between the clamp and the tool during formation of the loop and the making of the second bond. That time interval may include some searching. The time at which searching has been completed is identified as time 2. During the interval from time 1 to time 2, the tool and the clamp holder have occupied an elevated position, and the clamp has been open to permit free movement of the bond wire through the passage in the tool in both directions.

The tool having been positioned over the second bond point at time 2, the clamp is closed while the tool and the clamp remain in its uppermost position. Clamp closure is completed at time 3. Soon after, at time 4, the tool and the clamp are moved downwardly together to the second bond position arriving there at time 5. The tool and wire are in the position required for completion of the second bond, and that bond is made in the interval between times 5 and 7.

If the additional length of wire required to make the loop is to be provided by pushing that additional length through the tool as an incidence to relative movement between the clamp and the tool, the clamp does not remain in the dwell condition. In that form of the method, operation of the elements over certain time segments of the process are depicted by the dashed lines in FIG. 8. In the lower graph, the dashed lines show that the tool is not elevated to the higher position of the preferred method, but need be elevated only to a lower position, and it is maintained in that position in the interval from time 4 to time 5 while the clamp, then closed, is being moved toward the tool to pay some of the wire out of the tool to make it available for inclusion in the loop. The tool is moved downwardly in the interval from time 5 to time 6, down to the second bond position and the bond is created subsequent to time 6.

Although I have shown and described certain specific embodiments of my invention, I am fully aware that many modifications thereof are possible. My invention, therefore, is not to be restricted except insofar as is necessitated by the prior art.

I claim:
1. The method of making wire connections between circuit points on the surface of a miniature assembly of electronic elements through the medium of a bonding tool of the kind that includes an opening through which the bonding wire is threaded, which method comprises the steps of:
   arranging a length of wire such that it extends through the passage in the bonding tool with sufficient freedom to permit relative movement between the standing part of the wire and the tool in either direction through the passageway;
   bonding an end of said wire to a first circuit point using said tool;
   lifting the tool from the first bond point in a generally vertical direction while permitting the standing part of the wire to be payed out by being pulled through the tool;
   moving the tool laterally to a position directly over the second point;
   clamping said wire against movement through said passageway throughout the motion of said tool from said position over the second circuit point to said second circuit point; and
   lowering the tool to the second point such that the wire underlies the tool on said second circuit point while preventing movement of the wire in either direction through said passageway.

2. The invention defined in claim 1 in which the tool is moved from the position of the first bond to a position elevated sufficiently above said second circuit point such that the length of wire extending from said passageway to said first circuit point is enough to form a looped connection from said first circuit point to said second point.

3. The method of making wire connections between circuit points on the surface of a miniature assembly of electronic elements through the medium of a bonding tool of the kind that includes an opening through which the bonding wire is threaded, which method comprises the steps of:
   arranging a length of wire such that is extends through the passage in the bonding tool with sufficient freedom to permit relative movement between the standing part of the wire and the tool in either direction through the passageway;
   bonding an end of said wire to a first circuit point using said tool;
   lifting the tool from the first bond point in a generally vertical direction while permitting the standing part of the wire to be payed out by being pulled through the tool;
   moving the tool laterally to a position directly over the second circuit point;
   pushing a length of wire through the tool after the tool has been positioned above the second point and before the tool is lowered sufficiently to reach said second circuit point lowering the tool to the second point such that the wire underlies the tool on said second circuit point while preventing movement of the wire in either direction through said passageway.

4. The method of extending an electrical connector wire between relatively fixed first and second circuit points of an electrical assembly in the circumstance in which said circuit points lie substantially in parallel planes and in which said conductor wires are fixed to the circuit points by having a side of the wire bonded thereto, which method comprises the steps of:
   bonding a side of the wire near its end to one of said circuit points;
   paying out a length of wire from a source to a length longer than the distance between said circuit points such that a point on said length of wire lies directly over the other end of said circuit points, part of said length of wire being payed out by pushing a length of wire from the source of wire until said point on the length of wire lies over said other of said circuit points;
   lowering said point on said length of wire directly toward said other circuit point and there bonding it to said other circuit point.

* * * * *